(12) United States Patent
Takahashi et al.

(10) Patent No.: US 7,311,777 B2
(45) Date of Patent: Dec. 25, 2007

(54) PROCESS FOR MANUFACTURING QUARTZ CRYSTAL ELEMENT

(75) Inventors: Naoyuki Takahashi, Shizuoka (JP); Takato Nakamura, Shizuoka (JP); Satoshi Nonaka, Shizuoka (JP); Yoshinori Kubo, Shizuoka (JP); Yoichi Shinriki, Tokyo (JP); Katsumi Tamanuki, Tokyo (JP)

(73) Assignee: Humo Laboratory, Ltd, Tokyo (JP)

( * ) Notice: Subject to any disclaimer, the term of this patent is extended or adjusted under 35 U.S.C. 154(b) by 394 days.

(21) Appl. No.: 10/926,057

(22) Filed: Aug. 26, 2004

(65) Prior Publication Data

US 2006/0046076 A1    Mar. 2, 2006

(51) Int. Cl.
*G02B 6/13* (2006.01)

(52) U.S. Cl. .................... 117/104; 117/93; 117/94; 117/95

(58) Field of Classification Search .......... 117/1; 428/1
See application file for complete search history.

(56) References Cited

U.S. PATENT DOCUMENTS 6,844,074 B2 *  1/2005  Takahashi et al. .......... 428/426

* cited by examiner

*Primary Examiner*—Robert Kunemund
*Assistant Examiner*—Marissa W Chaet
(74) *Attorney, Agent, or Firm*—Nixon Peabody LLP; Jeffrey L. Costellia

(57) ABSTRACT

A process for manufacturing a quartz crystal element consists of the steps of producing plural quartz layers on a surface of a crystalline substrate having a lattice constant differing from that of quartz crystal, in which each of the quartz layers consists of a crystalline phase and an amorphous phase, and percentage of the crystalline phase in the quartz layer farther from the substrate is larger than percentage of the crystalline phase in the quartz layer adjacent to the substrate; and producing an epitaxially grown quartz crystal film on the surface of the quartz layer farther from the substrate by a reaction between silicon alkoxide and oxygen.

13 Claims, 4 Drawing Sheets

PROCESS FOR MANUFACTURING QUARTZ CRYSTAL ELEMENT

FIELD OF THE INVENTION

The present invention relates to a quartz crystal element and a process for manufacturing the same.

BACKGROUND OF THE INVENTION

Quartz crystal elements are used as oscillators, vibrators, surface acoustic wave devices for high frequency filters, light wave guides, semiconductor substrates, or parts thereof. A conventionally known method for manufacturing useful quartz crystal elements comprises a procedure of polishing a quartz single crystal obtained by hydrothermal synthesis to give a thin quartz crystal film. There are other known methods for manufacturing directly quartz crystal thin films, including the sol-gel process, the plasma chemical vapor deposition (CVD) process, the sputtering process, and the laser abrasion process. These manufacturing methods, however, have such problems as a poor yield of practically acceptable quartz crystal thin films and requirements for a large apparatus and strict control of manufacturing conditions. Thus, these methods are not necessarily advantageous as the industrial manufacturing process for quartz crystal thin films.

Japanese Patent Provisional Publication 2002-80296 describes an atmospheric pressure vapor phase epitaxy (AP-VPE) as a method for manufacturing quartz crystal thin films which is advantageously employable in industries. According to the atmospheric pressure vapor phase epitaxy, silicon alkoxide and oxygen are brought into contact with each other to react under atmospheric pressure, without using a vacuum apparatus, preferably in the presence of a catalyst such as hydrogen chloride to grow epitaxially and deposit a quartz crystal thin film on a substrate. The provisional publication further describes that, on forming a quartz crystal thin film on a substrate by the atmospheric pressure vapor phase epitaxy, a buffer layer is formed on the substrate in advance to improve the crystallinity of the depositing quartz crystal thin film thereon.

On the other hand, a quartz crystal thin film which has been grown with a preferentially oriented AT-cut plane is known to exert a particularly low temperature dependency when used as a vibrator and, accordingly, is acceptable as a superior element. There are known, however, no methods for selectively manufacturing a quartz crystal thin film having these characteristic, particularly manufacturing methods using a vapor phase process.

SUMMARY OF THE INVENTION

It is an object of the invention to provide a method for manufacturing a quartz crystal element having excellent crystal characteristics at a high yield using a simple vapor phase reactor.

It is another object of the invention to provide a method for manufacturing a quartz crystal element grown with a preferentially oriented AT-cut plane at a high yield using a simple vapor phase reactor.

It is a further object of the invention to provide a quartz crystal film grown with a preferentially oriented AT-cut plane.

The present invention resides in a process for manufacturing a quartz crystal element comprising the steps of:

producing at least two quartz layers on a surface of a crystalline substrate having a lattice constant differing from a lattice constant of quartz crystal, in which each of the quartz layers comprises a crystalline phase and an amorphous phase, and percentage of the crystalline phase in the quartz layer farther from the substrate is larger than percentage of the crystalline phase in the quartz layer adjacent to the substrate; and producing an epitaxially grown quartz crystal film on the surface of the quartz layer farther from the substrate by a reaction between silicon alkoxide and oxygen.

The invention further resides in a quartz crystal thin film manufactured by the aforementioned manufacturing process.

The invention particularly resides in a process for manufacturing a quartz crystal element comprising the steps of:

producing at least two quartz layers on a surface of a crystalline substrate having a lattice constant differing from a lattice constant of quartz crystal, in which each of the quartz layers comprises a crystalline phase and an amorphous phase, and percentage of the crystalline phase in the quartz layer farther from the substrate is larger than percentage of the crystalline phase in the quartz layer adjacent to the substrate; and producing an epitaxially grown quartz crystal film to grow with a preferentially oriented AT-cut plane on the surface of the quartz layer farther from the substrate by a reaction between silicon alkoxide and oxygen.

The invention further resides in a quartz crystal film with a preferentially oriented AT-cut plane manufactured by the aforementioned manufacturing process.

The invention further resides in a quartz crystal element, wherein a quartz crystal film grown with a preferentially oriented AT-cut plane is placed on a surface of a substrate having a lattice constant differing from that of a quartz crystal via at least two quartz layers in which each of the quartz layers comprises a crystalline phase and an amorphous phase, and percentage of the crystalline phase in a quartz layer farther from the substrate is larger than percentage of the crystalline phase in a quartz layer adjacent to the substrate.

The invention further resides in a quartz crystal element comprising a quartz crystal film grown with a preferentially oriented AT-cut plane and a quartz layer comprising a crystalline phase and an amorphous phase placed on one side of the quartz crystal film.

The invention furthermore resides in a quartz crystal film grown with a preferentially oriented AT-cut plane produced by vapor phase epitaxy.

DETAILED DESCRIPTION OF THE INVENTION

According to the process of the present invention, it becomes possible to manufacture a quartz crystal element having excellent crystal characteristics, particularly a quartz crystal element grown with a preferentially oriented AT-cut plane at a high yield using a simple vapor phase reactor. Further, the quartz crystal element of the invention has a high crystallinity to show superior physical characteristics.

Preferred embodiments of the process of the present invention are as follows.

(1) The quartz layer adjacent to the surface of the substrate comprises 1 to 50% of the crystalline phase and 99 to 50% of the amorphous phase and, on the other hand, the quartz layer adjacent to the surface of the quartz crystal film comprises 5 to 95% of the crystalline phase and 95 to 5% of the amorphous phase, wherein the percentage of the crystalline phase in the latter quartz layer is higher than that in the former quartz layer by 4% or more.

(2) The quartz layer consists of two layers, i.e., a lower side quartz layer in contact with the surface of the substrate, which comprises 1 to 50% of the crystalline phase and 99 to 50% of the amorphous phase; and an upper side quartz layer in contact with the surface of the quartz crystal film, which comprises 5 to 95% of the crystalline phase and 95 to 5% of the amorphous phase, wherein the percentage of the crystalline phase in the upper side quartz layer is higher than that in the lower side quartz layer by 4% or more.

(3) The quartz layers are formed by a reaction between silicon alkoxide and oxygen.

(4) Both the production of the quartz layers and the production of the quartz crystal film are conducted under atmospheric pressure.

(5) The substrate is a Si substrate, a GaAs substrate, or a sapphire substrate.

(6) The substrate is a sapphire substrate having a (110) A plane.

The process for manufacturing a quartz crystal element according to the invention are further described by referring to the figures illustrated in the attached drawings.

Figure 1:
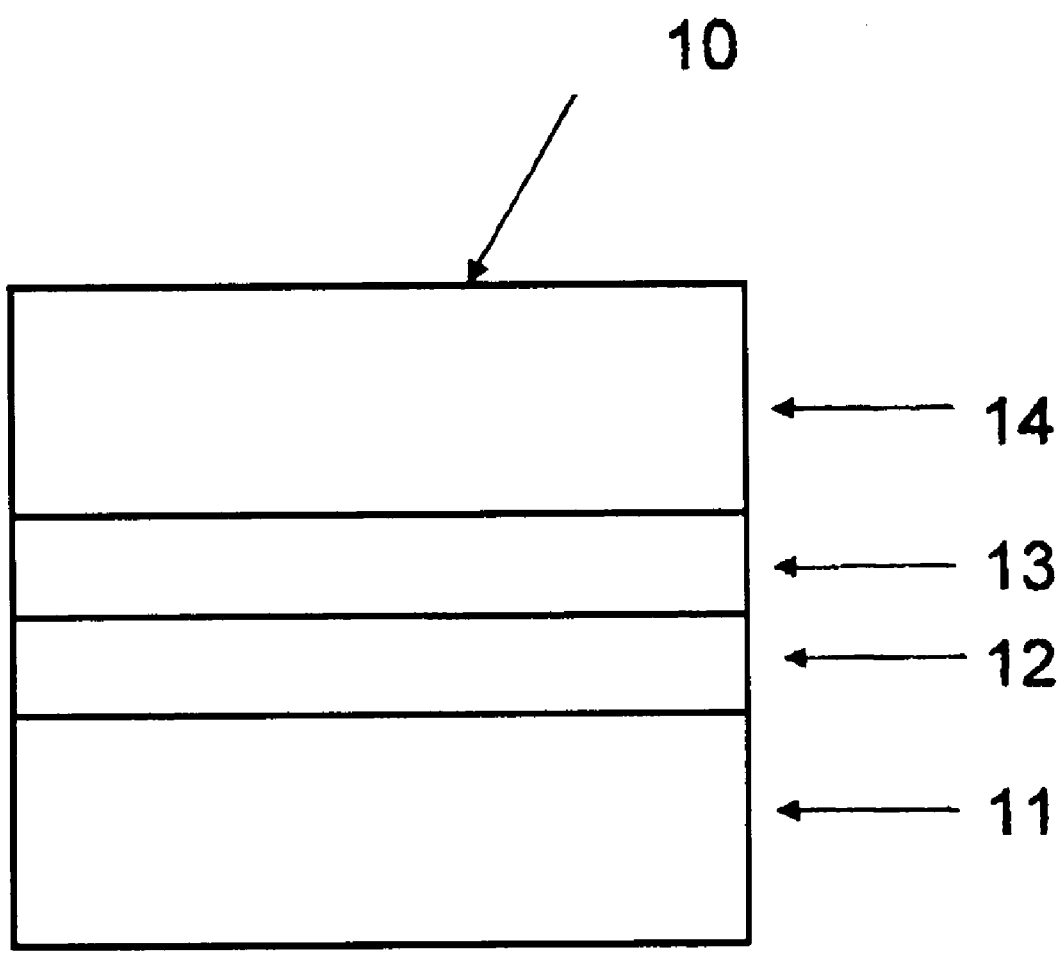
FIG. 1 shows a typical layer structure of a quartz crystal element obtained by the process according to the present invention.

FIG. 1 shows a typical layer structure of a quartz crystal element of the invention obtainable by the process of the invention. The quartz crystal element 10 has, on a substrate 11, a lower side quartz layer 12, an upper side quartz layer 13, and a quartz crystal thin film 14. Both the lower side quartz layer 12 and the upper side quartz layer 13 are understood to give a function of buffering an influence of the lattice constant of the substrate while maintaining the influence (function to control the plane orientation) on epitaxially growing the quartz crystal thin film on the substrate, particularly on depositing the epitaxially growing quartz crystal thin film with a preferentially oriented AT-cut plane. Accordingly, each of the layers is hereinafter referred to as the lower side buffer layer and the upper side buffer layer, respectively.

As the substrate, a crystalline substrate having a lattice constant differing from the lattice constant of quartz crystal is selected. The crystalline substrate preferably has a hexagonal crystal structure or has a surface on which the hexagonal atom arrangement is formed. Examples of such crystalline substrates include a Si substrate, a GaAs substrate, and a sapphire substrate. Particularly preferred is a sapphire substrate having a (110) A plane.

The substrate may be transparent or opaque. However, when the quartz crystal thin film is to be used as an optical element having the substrate, a transparent substrate is preferably employed. A preferred thickness range of the substrate is from 50 to 500 μm, and a particularly preferred range is from 100 to 300 μm.

The process for manufacturing a quartz crystal element according to the invention is characteristic in that at least two buffer layers are formed on a substrate before placing a quartz crystal thin film thereon. Each of these buffer layers is a thin layer comprising a crystalline phase and an amorphous phase. The percentage of the crystalline phase in the quartz layer farther from the substrate is adjusted to become larger than that in the quartz layer nearer to the substrate. A specific example is that the buffer layer 12 (the lower side buffer layer) at the side in contact with the surface of the substrate comprises 1 to 50% of a crystalline phase and 99 to 50% of an amorphous phase, and the buffer layer 13 (the upper side buffer layer) above the lower side buffer layer comprises 5 to 95% of a crystalline phase and 95 to 5% of an amorphous phase. The percentage of the crystalline phase in the upper side buffer layer is adjusted to become higher than that in the lower side buffer layer by 4% or more (preferably 5% or more, more preferably 10% or more; and preferably 40% or less, and more preferably 30% or less). The plural buffer layers, each of which has two phases and satisfies the aforementioned requirements, used in the process according to the invention have a function as a control layer for controlling the plane orientation for the growth of a quartz crystal thin film on the uppermost buffer layer.

In this connection, the quartz layer (buffer layer) comprising a crystalline phase and an amorphous phase can achieve the object of the invention only when the two layers satisfy the aforementioned requirements. If necessary, however, three or more layers can be placed. When three or more buffer layers are placed, the lowermost layer in contact with the substrate should satisfy the requirements for the aforementioned lower side buffer layer, and the uppermost layer should satisfy the requirements for the aforementioned upper side buffer layer. An intermediate layer(s) therebetween, however, needs to be a quartz layer comprising a crystalline phase and an amorphous phase, and the percentage of the crystalline phase in the intermediate quartz layer(s) is preferably higher than that in the lowermost layer and lower than that in the uppermost layer. When two or more quartz layers (intermediate buffer layers) are placed between the uppermost layer and the lowermost layer, the percentage of a crystalline phase in an upper side intermediate buffer layer is preferably higher than that in a lower side intermediate buffer layer.

Each of the buffer layers preferably has a thickness in the range from 10 to 1,000 nm, more preferably from 10 to 300 nm, and most preferably from 20 to 200 nm. Further, a lower buffer layer preferably has a thickness larger than that of an upper buffer layer.

At least two quartz layers (buffer layers) on the substrate are preferably produced by a reaction between silicon alkoxide and oxygen. The quartz crystal element of the invention is produced by a process of depositing an epitaxially grown quartz crystal thin film on the buffer layer utilizing a reaction between silicon alkoxide and oxygen. Consequently, it is preferable to form successively both the buffer layers and the quartz crystal thin film on the substrate using the identical starting materials.

The production of two or more quartz layers (buffer layers) using the aforementioned reaction between silicon alkoxide and oxygen and the formation of a quartz crystal thin film on the buffer layers are preferably conducted by the atmospheric pressure vapor phase epitaxy. As mentioned previously, the atmospheric pressure vapor phase epitaxy is described in detail in Japanese Patent Provisional Publication 2002-80296. Accordingly, the present specification gives only a simple description of the atmospheric pressure vapor phase epitaxy. The detailed explanation of the atmospheric pressure vapor phase epitaxy is described in Japanese Patent Provisional Publication 2002-80296.

The atmospheric pressure vapor phase epitaxy is a process of allowing a gaseous silicon alkoxide and oxygen to contact a substrate housed in a vessel under atmospheric pressure (the term "atmospheric pressure" herein means not only the atmospheric pressure but also a pressure close to the atmospheric pressure (ranging from half to twice the atmospheric pressure)) to deposit quartz produced by oxidation of silicon alkoxide on the substrate. Examples of the silicon alkoxides includes tetramethoxysilane, tetraethoxysilane, tetrapropoxysilane, tetrabuthoxysilane, and mixtures thereof combined arbitrarily. The oxygen can be an oxygensupply source such as ozone, dinitrogen monoxide or water. Since oxidation of silicon alkoxide is accelerated under the presence of a catalyst (or promoter) such as hydrogen chloride, employment of the catalyst is also preferred.

The buffer layer (a layer containing a mixed crystalline phase and amorphous phase) on the surface of the substrate using the reaction between silicon alkoxide and oxygen can be produced, for example, by conducting the reaction at a temperature (substrate temperature, same is applied hereinafter) lower than the temperature for producing the quartz crystal thin film by the reaction between the same silicon alkoxide and oxygen (for example, a temperature lower by 20° C. to 200° C.). On forming two or more buffer layers according to the invention, the formation of the upper side buffer layer is conducted at a temperature lower than the temperature to form the lower side buffer layer (for example, a temperature lower by 10° C. to 100° C.; a temperature in a range of 400° C. to 530° C.). After forming respective buffer layers, it is preferable to conduct adjustment of crystallinity by applying an annealing treatment.

In the process for manufacturing a quartz crystal element of the invention, two or more buffer layers are understood to have a lattice constant falling between that of the substrate and that of the quartz crystal thin film, particularly a lower buffer layer has a lattice constant near to that of the substrate and an upper buffer layer has a lattice constant near to that of the quartz crystal thin film. Thus, these buffer layers have a function to buffer the difference between the lattice constants of the substrate and quartz crystal thin film.

On two or more buffer layers, an epitaxially grown quartz crystal thin film is formed by the reaction between silicon alkoxide and oxygen. The quartz crystal thin film is preferably formed by the atmospheric pressure vapor phase epitaxy similar to the aforementioned buffer layer formation. When the quartz crystal thin film is deposited to form on the buffer layer, the substrate temperature is preferably set to a temperature higher than the substrate temperature on forming the buffer layer by 20° C. to 200° C. The optimum substrate temperature for producing the quartz crystal thin film, however, is in the range of 550° C. to 600° C.

In the process according to the invention, the use of a Si substrate, a GaAs substrate or a sapphire substrate as the substrate, particularly a sapphire substrate having a (110) A plane is preferred to produce easily a quartz crystal thin film with a preferentially oriented AT-cut plane (that is, a cut plane is preferentially oriented offsetting by about 3° from the substrate surface, or specifically from the (110) A plane of the sapphire substrate) grown on the two or more buffer layers.

The quartz crystal thin film produced on the substrate via two or more buffer layers can be separated from the substrate and the buffer layers by heating or cooling the produced composite body by the difference between respective thermal expansion coefficients of the substrate, the buffer layers and the quartz crystal thin film. Alternatively, the quartz crystal thin film can be separated from the substrate while leaving one or more buffer layers thereto utilizing the similar temperature control. The quartz crystal thin film thus separated from the substrate is employable as an oscillator, a vibrator, a surface acoustic wave device for a high frequency filter, a light wave guide, a semiconductor substrate, or parts thereof after conducting a succeeding prescribed processing. When a transparent substrate is employed, the quartz crystal thin film can be utilized as an optical component without separating the substrate.

EXAMPLE

A quartz crystal thin film was produced from tetraethoxysilane [$Si(OC_2H_5)_4$: 99.999%] and oxygen [99.999%] in the presence of hydrogen chloride on a polished surface of an optical grade sapphire substrate [(110) A plane, 10 mm×10 mm] under the conditions given below using the atmospheric pressure vapor phase epitaxy (AP-VPE).

(1) A vertical reactor made of quartz was prepared, in which a sapphire substrate was mounted. Then, the substrate was heated to 500° C. While keeping the substrate at a temperature of 500° C., a nitrogen gas which had passed through tetraethoxysilane heated to 70° C. (a nitrogen gas-diluted tetraethoxysilane gas) was introduced into the reactor for 30 minutes. The nitrogen gas-diluted oxygen gas was also introduced into the reactor and, at the same time, a nitrogen gas-diluted hydrogen chloride gas (catalyst) was introduced into the reactor to decompose the tetraethoxysilane gas to deposit and grow the produced quartz compound on the substrate. Thus, a lower side buffer layer was formed. The introduction of these gases into the reactor was performed through respective gas introduction ports.

The tetraethoxysilane gas, oxygen and hydrogen chloride gas were introduced into the reactor so that partial pressures became $3.3 \times 10^2$ Pa, $3.3 \times 10^4$ Pa and $1.7 \times 10^2$ Pa, respectively.

Thus formed lower side buffer layer had a thickness of 100 nm and was composed of 10% of a crystalline phase and 90% of an amorphous phase.

Subsequently, the introduction of respective gases into the reactor was stopped, and the substrate was heated to 550° C. for 15 minutes to anneal the lower side buffer layer.

(2) Subsequently, the substrate temperature was lowered to 450° C., and the introduction of respective gases was resumed to decompose the tetraethoxysilane gas for 30 minutes, whereby deposing and growing the produced quartz on the lower side buffer layer on the substrate to form an upper side buffer layer.

Thus formed upper side buffer layer had a thickness of 50 nm, and was composed of 25% of a crystalline phase and 75% of an amorphous phase.

Then, the introduction of respective gases to the reactor was stopped, and the substrate was heated to 570° C. for 15 minutes to anneal the upper side buffer layer.

(3) Finally, the introduction of respective gases was resumed while maintaining the temperature of the substrate at 570° C., whereby decomposing the tetraethoxysilane gas over 60 minutes to deposit and grow epitaxially the produced quartz on the upper side buffer layer above the substrate, to form a quartz crystal thin film. Thus formed quartz crystal thin film had a thickness of 11 μm.

Figure 2:
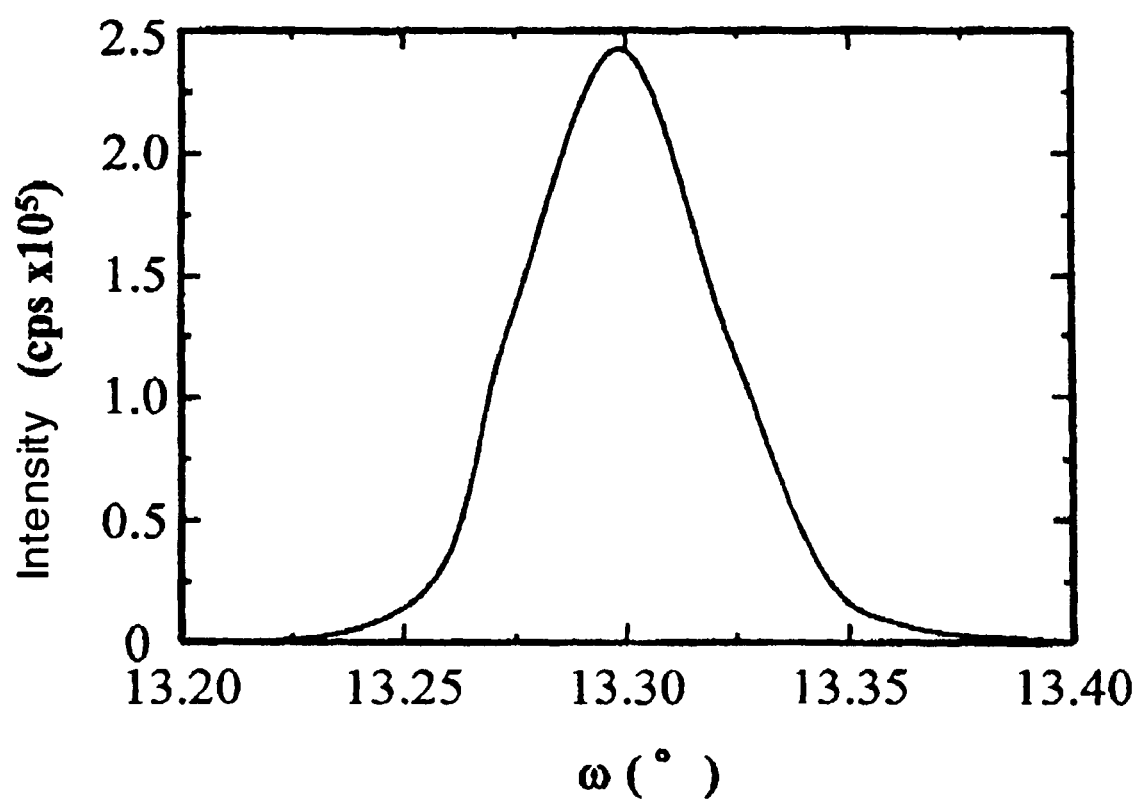
FIG. 2 shows an X-ray diffraction chart of a quartz crystal element obtained in the Example.
Figure 3:
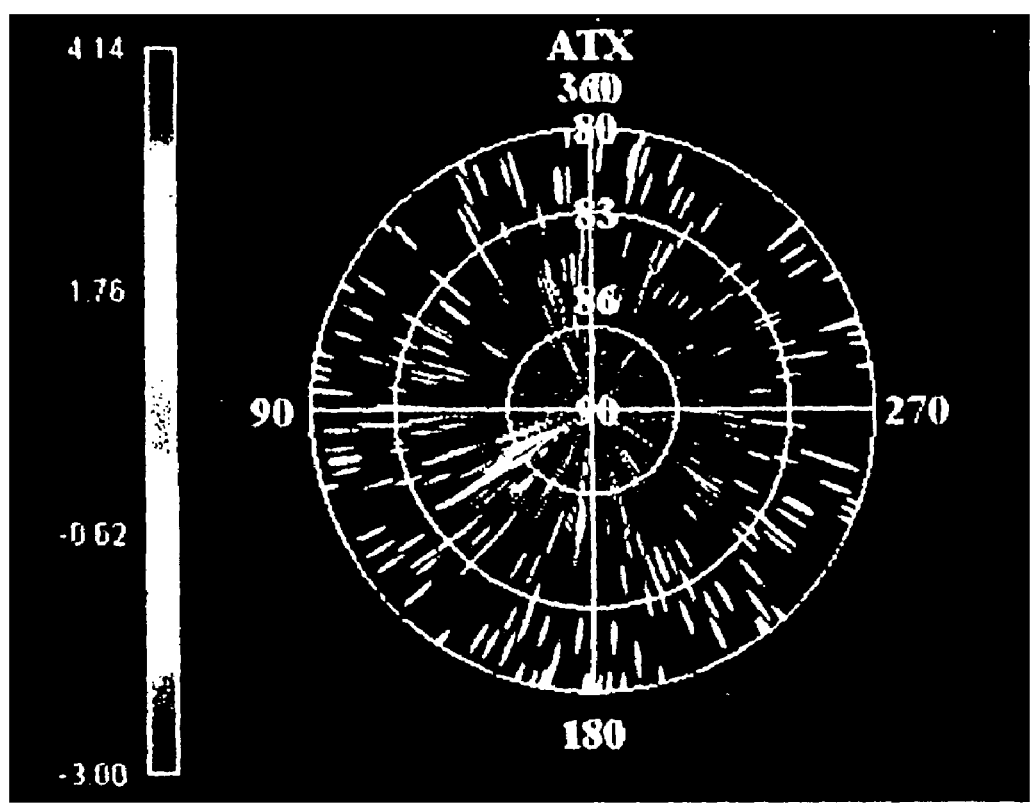
FIG. 3 shows an X-ray pole figure of a quartz crystal element obtained in the Example.

(4) The formed quartz crystal thin film was separated from the substrate utilizing a temperature control. The separated quartz crystal thin film was subjected to X-ray diffractometry and X-ray pole figure measurement to give the X-ray diffraction graph and X-ray pole figure shown in FIGS. 2 and 3, respectively. From these results, it was confirmed that the quartz crystal thin film was preferentially oriented to a plane tilted by about 3° from the (011) plane. This is called the AT-cut plane. Furthermore, since the half value width of the X-ray diffraction graph was narrow, it was confirmed that the quartz crystal thin film had a high crystallinity.

Figure 4:
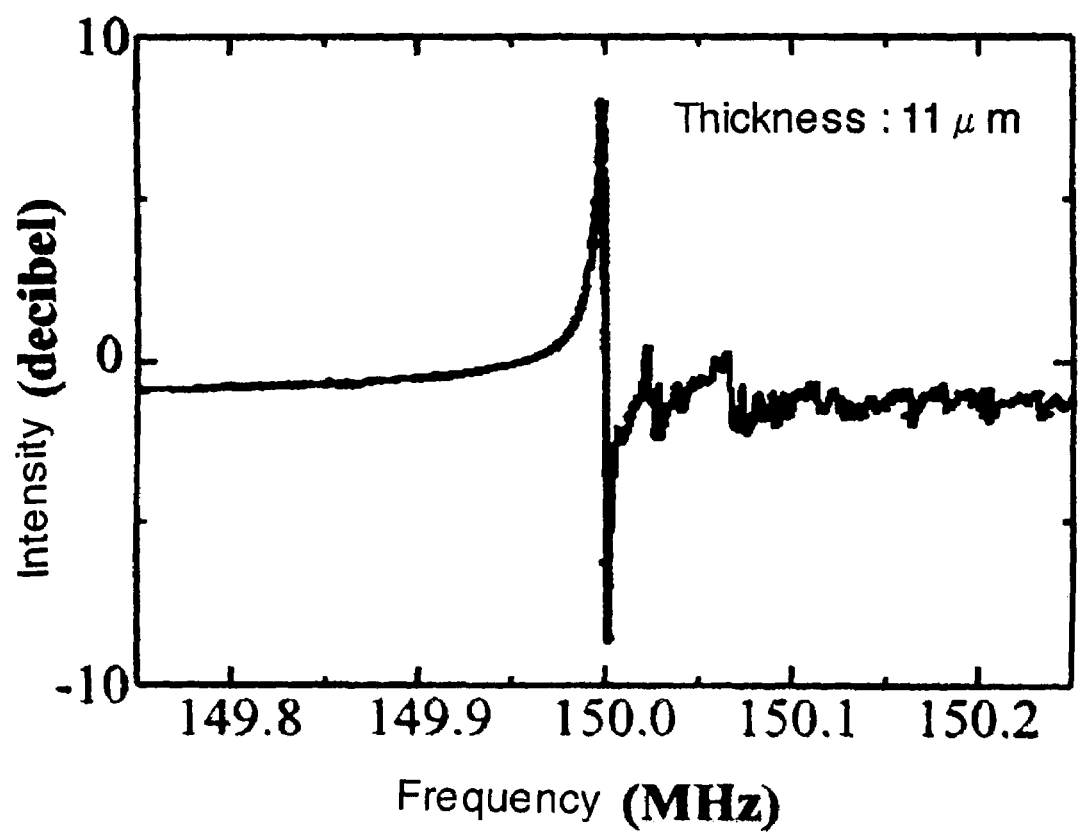
FIG. 4 shows a measurement figure obtained by waveform measurement of a quartz crystal element of the Example by a network analyzer.

In addition, the quartz crystal thin film was subjected to the waveform measurement using a network analyzer to confirm the oscillation of fundamental wave at 150 MHz, as shown in FIG. 4. For a quartz crystal thin film correctly oriented to the AT-cut plane, it is known that the film thickness and the oscillation frequency satisfy the following relation.

Oscillation frequency f (MHz)=1666/film thickness (μm)

The obtained quartz crystal thin film satisfies the above formula. Consequently, it was confirmed that the aforementioned quartz crystal thin film was preferentially oriented to the AT-cut plane.

What is claimed is:

1. A process for manufacturing a quartz crystal element comprising the steps of:
   producing at least two quartz layers on a surface of a crystalline substrate having a lattice constant differing from a lattice constant of quartz crystal, in which each of the quartz layers comprises a crystalline phase and an amorphous phase, and percentage of the crystalline phase in the quartz layer farther from the substrate is larger than percentage of the crystalline phase in the quartz layer adjacent to the substrate;
   and
   producing an epitaxially grown quartz crystal film on the surface of the quartz layer farther from the substrate by a reaction between silicon alkoxide and oxygen.

2. The process of claim 1, wherein the quartz layer adjacent to the surface of the substrate comprises 1 to 50% of a crystalline phase and 99 to 50% of an amorphous phase, and the quartz layer adjacent to the surface of the quartz crystal film comprises 5 to 95% of a crystalline phase and 95 to 5% of an amorphous phase, and the percentage of the crystalline phase in the latter quartz layer is higher than the percentage of the crystalline phase in the former quartz layer by 4% or more.

3. The process of claim 1, wherein the quartz layer consists of two layers of a lower quartz layer adjacent to the surface of the substrate which comprises 1 to 50% of a crystalline phase and 99 to 50% of an amorphous phase, and an upper quartz layer adjacent to the surface of the quartz crystal film which comprises 5 to 95% of a crystalline phase and 95 to 5% of an amorphous phase, and the percentage of the crystalline phase in the upper quartz layer is higher than the percentage of the crystalline phase in the lower quartz layer by 4% or more.

4. The process of claim 1, wherein the quartz layers are produced by the reaction between silicon alkoxide and oxygen.

5. The process of claim 1, wherein both the quartz layers and the quartz crystal film are produced under atmospheric pressure.

6. The process of claim 1, wherein the substrate is a Si substrate, a GaAs substrate, or a sapphire substrate.

7. A process for manufacturing a quartz crystal element comprising the steps of:
   producing at least two quartz layers on a surface of a crystalline substrate having a lattice constant differing from a lattice constant of quartz crystal, in which each of the quartz layers comprises a crystalline phase and an amorphous phase, and percentage of the crystalline phase in the quartz layer farther from the substrate is larger than percentage of the crystalline phase in the quartz layer adjacent to the substrate;
   and
   producing an epitaxially grown quartz crystal film to grow with a preferentially oriented AT-cut plane on the surface of the quartz layer farther from the substrate by a reaction between silicon alkoxide and oxygen.

8. The process of claim 7, wherein the quartz layer adjacent to the surface of the substrate comprises 1 to 50% of a crystalline phase and 99 to 50% of an amorphous phase, and the quartz layer adjacent to the surface of the quartz crystal film comprises 5 to 95% of a crystalline phase and 95 to 5% of an amorphous phase, and the percentage of the crystalline phase in the latter quartz layer is higher than the percentage of the crystalline phase in the former quartz layer by 4% or more.

9. The process of claim 7, wherein the quartz layer consists of two layers of a lower quartz layer adjacent to the surface of the substrate which comprises 1 to 50% of a crystalline phase and 99 to 50% of an amorphous phase, and an upper quartz layer adjacent to the surface of the quartz crystal film which comprises 5 to 95% of a crystalline phase and 95 to 5% of an amorphous phase, and the percentage of the crystalline phase in the upper quartz layer is adjusted to become higher than the percentage of the crystalline phase in the lower quartz layer by 4% or more.

10. The process of claim 7, wherein the quartz layers are produced by the reaction between silicon alkoxide and oxygen.

11. The process of claim 7, wherein both the quartz layers and the quartz crystal film are produced under atmospheric pressure.

12. The process of claim 7, wherein the substrate is a Si substrate, a GaAs substrate, or a sapphire substrate.

13. The process of claim 7, wherein the substrate is a sapphire substrate having a (110) A plane.

* * * * *